(12) United States Patent
Fujimoto et al.

(10) Patent No.: US 8,044,408 B2
(45) Date of Patent: Oct. 25, 2011

(54) SIC SINGLE-CRYSTAL SUBSTRATE AND METHOD OF PRODUCING SIC SINGLE-CRYSTAL SUBSTRATE

(75) Inventors: Tatsuo Fujimoto, Tokyo (JP); Kohei Tatsumi, Tokyo (JP); Taizo Hoshino, Tokyo (JP); Masakazu Katsuno, Tokyo (JP); Noboru Ohtani, Sanda (JP); Masashi Nakabayashi, Tokyo (JP); Hiroshi Tsuge, Tokyo (JP); Housei Hirano, Tokyo (JP); Hirokatsu Yashiro, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 244 days.

(21) Appl. No.: 12/469,299

(22) Filed: May 20, 2009

(65) Prior Publication Data

US 2010/0295059 A1    Nov. 25, 2010

(51) Int. Cl.
*H01L 29/15* (2006.01)
(52) U.S. Cl. ............... 257/77; 257/70; 257/76; 257/94; 257/96; 257/98
(58) Field of Classification Search .................. None
See application file for complete search history.

(56) References Cited

U.S. PATENT DOCUMENTS

2008/0237609 A1* 10/2008 Powell et al. .............. 257/77

FOREIGN PATENT DOCUMENTS

| JP | 05-262599 A | 10/1993 |
| JP | 08-143396 A | 6/1996 |
| JP | 2003-119097 A | 4/2003 |

OTHER PUBLICATIONS

Yu. M. Tairov et al., "General Principles of Growing Large-Size Single Crystals of Various Silicon Carbide Polytypes", Journal Crystal Growth, vol. 52 (1981), pp. 146-150.
Kazuyuki Koga et al., "SiC Blue Light Emitting Diode", p. 23-29, Paper of Electronic Material Committee, No. EFM-88-24-P24, The Institute of Electrical Engineering of Japan, (1988).

* cited by examiner

*Primary Examiner* — N Drew Richards
*Assistant Examiner* — Kyoung Lee
(74) *Attorney, Agent, or Firm* — Birch, Stewart, Kolasch & Birch, LLP

(57) ABSTRACT

The invention provides a high-quality SiC single-crystal substrate, a seed crystal for producing the high-quality SiC single-crystal substrate, and a method of producing the high-quality SiC single-crystal substrate, which enable improvement of device yield and stability. Provided is an SiC single-crystal substrate wherein, when the SiC single-crystal substrate is divided into 5-mm square regions, such regions in which dislocation pairs or dislocation rows having intervals between their dislocation end positions of 5 μm or less are present among the dislocations that have ends at the substrate surface account for 50% or less of all such regions within the substrate surface and the dislocation density in the substrate of dislocations other than the dislocation pairs or dislocation is 8,000/cm$^2$.

9 Claims, 2 Drawing Sheets

SIC SINGLE-CRYSTAL SUBSTRATE AND METHOD OF PRODUCING SIC SINGLE-CRYSTAL SUBSTRATE

FIELD OF THE INVENTION

The present invention relates to a SiC single-crystal and a method of producing the same.

BACKGROUND ART

SiC semiconductors utilizing SiC single-crystal are viewed as promising candidates for next-generation power devices to replace Si transistors. Applications as substrates for blue light-emitting diodes and laser diodes are also expected.

In addition to being physically and chemically stable, SiC single-crystal is a material that can withstand high temperature and radiation. It is therefore thought to have potential for application as an environment-resistant semiconductor material. Moreover, SiC power devices are also attracting attention, particularly as energy-saving devices, because the power loss in the device can be reduced greatly in comparison with that in a conventional Si device.

However, no crystal growth technology has yet been established that can provide a stable supply of high-quality SiC single crystal of large surface area on an industrial scale. SiC has therefore not been put to extensive practical use in spite of being a semiconductor material having the numerous merits and high potential explained in the foregoing.

As a currently available method for obtaining high-quality SiC single crystal of relatively large diameter, there is known the modified Lely process, which conducts sublimation recrystallization using an SiC single-crystal substrate as a seed (Yu. M. Tairov and V. F. Tsvetkov, Journal of Growth, vol. 52 (1981) pp. 146-150). Owing to its use of a seed crystal, this process can control the crystal nucleation process and, by controlling the ambient inert gas pressure, can control crystal growth rate with good reproducibility. The modified Lely process makes it possible to grow SiC single crystal while controlling its polytype (6H, 4H etc.), carrier type and concentration. Currently, 2-inch (about 50 mm) to 3-inch (about 75 mm) SiC single-crystal wafers are being produced by the process, processed into substrates and subjected to epitaxial thin film growth and device fabrication.

However, current commercially available SiC single-crystal substrates have many quality problems, and crystal quality improvement is essential for making SiC single crystal and SiC single crystal devices suitable for practical use in the future.

Elimination of the leak current and other unstable characteristics arising in the SiC semiconductor is indispensable for realizing high-performance SiC power devices with stable characteristics. The cause of the unstable characteristics is thought to be related to the quality of the SiC single-crystal substrate. The degradation of the quality is thought to be caused mainly by crystallographic defects formed in the substrate, namely, micropipe defects, dislocation defects and the like. Various efforts have been made regarding micropipe defects, particularly with regard to reducing them, and fabrication of substrates with no micropipes has been reported to be possible. However, methods available for reducing dislocation defects are almost all ones that rely on special processes such as converting the growth crystal surface, as taught by, for example, Japanese Patent Publication (A) Nos. H5-262599, H8-143396, and 2003-119097, and no simple industrially effective means is known.

Japanese Patent Publication (A) No. H5-262599 teaches a method for obtaining good quality SiC single crystal. Specifically, it teaches that in a sublimation recrystallization process for growing SiC single crystal on a seed crystal of an SiC single-crystal substrate, it is effective to use as the seed crystal one composed of SiC single crystal in which a crystal plane at an offset angle of about 60° to about 120° from the {0001} plane is exposed. Japanese Patent Publication (A) No. H8-143396 teaches a method in which a first SiC single crystal is grown using as a first seed crystal a crystal plane of an SiC single crystal inclined about 60° to about 120° from the {0001} plane, a wafer having a {0001} plane is newly taken from the first SiC single crystal, and crystal is grown using the new wafer as a second seed crystal. Japanese Patent Publication (A) No. 2003-119097 teaches a method of producing low-defect crystal. In each of a first growth process, (n−1)th growth process, and nth growth process, a different crystal plane is cut, and cut as a seed crystal that is grown.

In the case of producing a final device, the general practice is to use a plane near the {0001} plane, and in the sublimation recrystallization processes, which fundamentally always grow crystal on a seed crystal, it is considered that the methods, which all cut a different plane, grow it as a seed, and again conduct final growth on the {0001} plane, are unsuitable as processes intended for mass production.

As a result, the situation today is that the market is being supplied with almost no products of a dislocation density lower than 8,000/cm$^2$.

Moreover, although device properties are thought to be affected by dislocation pairs, dislocation rows and the like formed during growth near the {0001} plane by convergence of dislocations believed to be formed at high temperature owing to interaction between displacements, no effective method of suppressing them has been reported.

Evaluation of SiC single crystal is set out in The Institute of Electrical Engineers of Japan, Electronic Materials Research Group, Document No. EFM-88-24, p. 24, Sep. 5, 1988. According to this reference, examination of a crystal for defects by molten KOH etching causes many etch pits to occur in correspondence to the dislocations.

SUMMARY OF THE INVENTION

As pointed out in the foregoing, although devices using SiC crystal substrates are viewed as promising next-generation power devices to replace the current Si generation, they are inadequate in the stability of device properties and poor in yield. The primary reason for this is substrate defects, particularly micropipes. However, it is believed that even if substrates totally free of micropipes should be used, device property stability and yield would still be inadequate for achieving wide utilization. In addition, no effective method has yet been found for reducing dislocations, which have also drawn attention as defects. Moreover, it is also not clear how effective it is to reduce which defects to what degree, as can be seen from the fact that in some cases device operation and property stability are satisfactory even when dislocations are present.

The present invention was made in light of such existing problems and has as its object to enable improvement of device yield and stability by providing a high-quality SiC single-crystal substrate, a seed crystal for producing the high-quality SiC single-crystal substrate, and a method of producing the high-quality SiC single-crystal substrate.

The present invention enables enhancement of device quality and yield by reducing dislocations having ends at the substrate surface and reducing dislocations among those having ends at the substrate surface that are proximate dislocation pairs or dislocation rows with diminished spacing.

The gist of the present invention is as set out below.

(1) An SiC single-crystal substrate wherein, when the SiC single-crystal substrate is divided into 5-mm square regions, such regions in which dislocation pairs or dislocation rows having intervals between their dislocation end positions of 5 µm or less are present among the dislocations that have ends at the substrate surface account for 50% or less of all such regions within the substrate surface.

(2) An SiC single-crystal substrate wherein, when the SiC single-crystal substrate is divided into 5-mm square regions, such regions in which dislocation pairs or dislocation rows having intervals between their dislocation end positions of 5 µm or less are present among the dislocations that have ends at the substrate surface account for 10% or less of all such regions within the substrate surface.

(3) An SiC single-crystal substrate according to (1) or (2), wherein the dislocation density in the substrate of dislocations other than the dislocation pairs or dislocation rows is 8,000/cm$^2$ or less.

(4) An SiC single-crystal substrate according to any of (1) to (3), wherein the polytype of the SiC single-crystal substrate is 4H or 6H.

(5) An SiC single-crystal substrate according to any of (1) to (4), wherein the plane direction of the SiC single-crystal substrate is a {0001} plane or a direction inclined within 10° from a {0001} plane.

(6) An SiC single-crystal substrate according to any of (1) to (5), wherein the SiC single-crystal substrate is substantially disk-shaped and the disk has a diameter of 60 mm or greater.

(7) An SiC single-crystal substrate according to any of (1) to (6), wherein the SiC single-crystal substrate contains nitrogen atoms at the rate of $1 \times 10^{18}$ cm$^{-3}$ or greater.

(8) A method of producing an SiC single-crystal substrate, comprising a step of growing SiC single crystal by a sublimation recrystallization process using the substrate set out in (5) as a seed crystal.

(9) A method of producing an SiC single-crystal substrate according to (8), wherein the crystal growth proceeds substantially in the <0001>direction or a direction inclined within 10° from the <0001>direction.

(10) A method of producing an SiC single-crystal substrate in which SiC single crystal is grown by a sublimation recrystallization process using a seed crystal, which method comprises a step of subjecting the crystal in the course of crystal growth on the seed crystal or the grown crystal to a thermal cycling treatment of repeating three or more temperature cycles at a temperature of 2,000° C. or greater and a temperature difference of 50° C. or greater.

(11) A method of producing an SiC single-crystal substrate, comprising a step of cutting and polishing an SiC single crystal set out in any of (8) to (10).

(12) An SiC single-crystal substrate with an epitaxial film comprising an SiC single-crystal formed with a 3-µm to 30-µm thick epitaxial thin film, wherein, when the thin-film surface of the SiC single-crystal formed with the epitaxial thin film is divided into 5-mm square regions, such regions in which dislocation pairs or dislocation rows having intervals between their dislocation end positions of 5 µm or less are present among the dislocations that have ends at the substrate surface account for 50% or less of all such regions within the substrate surface.

(13) An SiC single-crystal substrate with an epitaxial film according to (12), wherein the SiC single-crystal substrate is an SiC single crystal set out in any of (1) to (7).

In the present invention, dislocations in the crystal can be aggregated or annihilated at proximal locations by moving them under high-temperature condition. In a substrate cut and processed from a crystal produced in accordance with the present invention, it is possible to increase regions in which the density of dislocations having ends at the surface is greatly reduced, whereby a device fabricated using the substrate can realize stable electrical properties and high yield.

THE MOST PREFERRED EMBODIMENT

Figures 1, 2:
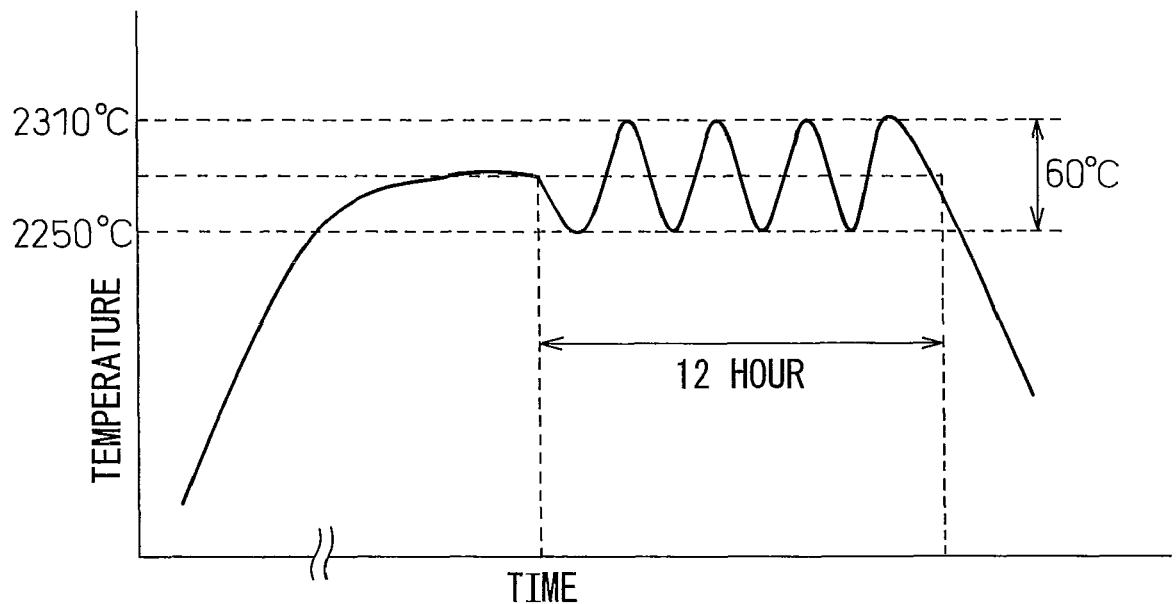
FIG. 1 is a diagram for explaining the division of the invention SiC single-crystal substrate into regions.
FIG. 2 is a diagram for explaining a temperature cycle applied in the present invention.

The present invention provides a high-quality SiC substrate on which devices can be fabricated. Ideally, the substrate should be free of defects, but industrial production of substrates with no defects is very difficult. Moreover, the production method would not be practical owing to the need for complicated processes and very low productivity. While among the different kinds of defects, micropipes have a particularly strong influence on the stability of device properties, it has become possible to produce substrates having 0.1 micropipe/cm$^2$ or less and also possible to maintain equivalent micropipe density during crystal growth by using such a substrate as seed crystal. However, an adequate level of device quality stability has not yet been reached even in the absence of micropipes. Although the dislocations, which are a kind of substrate defect, might be considered a problem, the fact is that device operation has been observed even in cases where the number of dislocations present is at or above the $8 \times 10^3$/cm$^2$ level. Thus, the relationship between dislocations and quality stability degradation has been unclear.

Among the dislocations present in the substrate, attention was focused on dislocation pairs and dislocation rows formed by interactive movement of dislocations toward one another. It was discovered that reducing the number of regions in which such defects were present enabled production of devices of high stability at high yield. Pairs and rows of dislocations separated by 5 µm or less were found to have a particularly strong effect on device stability. And it was concluded to be preferable from the aspect of securing better device quality and stability to reduce the number of dislocation pairs and dislocation rows composed of dislocations separated by 10 µm or less. The regions were defined as 5-mm squares because devices of around 5-mm square size or larger are effective for exploiting the advantageous properties of semiconductors fabricated using SiC as the substrate. Also in the case of devices larger than 5-mm square, it is similarly effective for the area of regions free of dislocation pairs and dislocation rows to account for a large part of the total. An SiC device yield based on device stability of at least about 50% is considered adequate for making replacement of Si devices with SiC devices practical. A practical substrate was therefore defined as one in which regions in which dislocation pairs and/or dislocation rows are present account for 50% or less of all regions. In order to accelerate practical application by reducing cost and upgrading quality stability, the ratio of such regions is preferably 10% or less, and taking high-temperature thermal treatment and the like during device fabrication into account, the dislocation density of regions having no dislocation pairs or dislocation rows is preferably 8,000/cm$^2$ or less and more preferably 4,000/cm$^2$ or less.

The modified Lely process uses a seed crystal and grows crystal on the seed crystal. If a dislocation having an end at the seed crystal surface is present, the dislocation defect is reproduced in the growing crystal.

Moreover, new dislocations may occur during growth owing to thermal stress and the like. And dislocations have stress fields, so that interaction between dislocations increases the number of dislocations that move near one another during growth. It was found that when so-formed dislocation pairs and/or dislocation rows are present during device fabrication, then, at one and the same total number of dislocations, device yield and stability are better when the dislocation pairs and dislocation rows are aggregated in specific regions than when they are evenly distributed. In this invention, it was found that for reducing the number of regions in which dislocation pairs or dislocation rows are present, it is effective to reduce the number of dislocation pairs and dislocation rows generated from the seed crystal and simultaneously to move and aggregate the dislocations present in the crystal during growth.

As a method for increasing the number of regions with few defects by moving dislocations during crystal growth can be mentioned that of controlling the crystal temperature during growth. But the activation energy of dislocation motion in SiC crystal is very high, so that adequate movement cannot be achieved by just heating to a high temperature. It is effective for moving dislocations during growth to establish a temperature gradient between the center and periphery of the crystal during growth of about 5 to 20° C./cm, with the peripheral temperature being higher. The crystal temperature at this time is preferably 2,000° C. or greater. Moreover, it is effective for moving dislocations to subject the crystal in the course of crystal growth to a thermal cycling treatment of repeating three or more temperature cycles at a temperature of 2,000° C. or greater and over a temperature range of 30 to 500° C., preferably 50 to 500° C. This is because point defects present due to thermal equilibrium tend to be generated in greater number on the high-temperature side, and dislocations and other defects are absorbed and annihilated on the low-temperature side, thus producing a driving force for dislocation movement. In other words, it is thought that the temperature cycle of shifting repeatedly between high temperature and low temperature during the thermal cycling treatment generates and annihilates point defects, whereby dislocation movement is promoted. The time of each cycle is 1 hr or greater and more preferably 3 hr or greater. A cycle time of greater than 20 hr is undesirable because it is inefficient within the growth period. The number of temperature cycles is 3 or greater and preferably 5 or greater. At fewer than 3 cycles, the degree of dislocation movement is not substantially different from that during the heat history at the time of ordinary crystal growth, i.e. in the processes of raw material heating, crystal growth and cooling. There is therefore observed only weak effect of reducing dislocations by inhibiting the increase in dislocations caused by introduction of strain during crystal heating, cooling and crystal growth. Thermal cycling treatment of conducting 3 or more temperature cycles effectively generates low-defect regions by dislocation movement. Although a larger number of temperature cycles is desirable, the appropriate upper limit within which productivity is not impaired is considered to be 300 or less. The thermal cycling treatment is also effective when conducted after crystal growth but is preferably conducted in the course of crystal growth.

Partial decomposition tends to occur at a temperature of 2,550° C. or greater, and heating for 1 hr or longer at such a temperature is undesirable because it may introduce new defects. The temperature, time and temperature range in the individual temperature cycles of the thermal cycling treatment do not need to be the same and different combinations thereof are possible within the aforesaid condition ranges.

Owing to the interaction of the dislocations, the dislocation movement makes the presence of dislocations in the regions uneven and also increases the probability of dislocation annihilation, thus also having an effect of reducing total dislocation density. The crystal used as the seed crystal preferably has a total dislocation density of 30,000/cm$^2$ or less. The density of dislocations not included in dislocation pairs or dislocation rows is preferably 15,000/cm$^2$ or less.

Good effect is obtained when a seed crystal is cut from crystal grown by the method of the present invention and the method of the present invention that imparts thermal cycling treatment is applied again. Similarly repeating the thermal cycling treatment multiple times, preferably 3 or more times, is effective for obtaining a high-quality crystal. However, when the number of dislocations in the crystal becomes extremely low, maintenance of the crystal structure during crystal growth becomes unstable, causing ready appearance of different polycrystalline or polymorphic defects. Of particular note is that when utilizing a seed crystal that uses the {0001} surface or a surface inclined within 10° from the {0001} surface as the growth surface, application as a production method for stable industrial growth is enabled when, for stable growth, the dislocation density of the final grown crystal is a total dislocation density including dislocation pairs and dislocation rows of, preferably, about 300/cm$^2$ or greater and more preferably, about 1,000/cm$^2$ or greater.

On the other hand, in order to ensure property stability when fabricating a device, reduction of the crystal dislocation density is preferable, and no marked decline in yield is observed insofar as no dislocation rows are present and the dislocation density is in the region of 8,000/cm$^2$ or less.

For achieving the aforesaid control of the dislocation distribution and a crystal stabilizing effect, it is effective to include nitrogen atoms as impurity, preferably at the rate of $1 \times 10^{18}$ cm$^{-3}$ or greater and more preferably $5 \times 10^{18}$ cm$^{-3}$. Particularly when producing 4H crystal, inclusion of nitrogen atoms at the rate of $1 \times 10^{18}$ cm$^{-3}$ or greater is desirable for realizing the aforesaid effect without generating new defects. The upper limit of nitrogen atom content is $8 \times 10^{20}$ cm$^{-3}$ or less because crystallinity deteriorates markedly at a higher density.

Although production of power devices utilizing SiC single crystal generally uses 4H crystal, the aforesaid method is also effective for controlling dislocation pairs and dislocation rows in 6H crystal. As for the crystal surface used, fabrication on the {0001} surface or a surface inclined within 10° from the {0001} surface is superior from the aspect of device properties. From the viewpoint of substrate productivity and industrial production, it is preferable to produce crystal in the same crystal orientation, use a seed crystal cut from the crystal substantially perpendicular to the growth direction or within 10° from perpendicular thereto, and further repeat the process of growing a device substrate or seed substrate thereon.

An SiC epitaxial thin film is generally formed on the substrate upper surface when fabricating a device. However, it is known that the substrate defects are reproduced in the thin film. It is therefore important to control the dislocation distribution of the crystal substrate surface by the method described in the foregoing. Movement and annihilation of dislocation pairs and dislocation rows during epitaxial growth is difficult. In the case of device fabrication, the thickness of the epitaxial thin film is generally 3 µm to 30 µm.

In the case of both device fabrication and crystal production, a crystal of large diameter is preferable for realizing low production cost but makes control of crystal defects difficult. In the case of a crystal of 50 mm or greater diameter, the aforesaid dislocation defect control is particularly effective for enhancing crystal quality to a high level, and in the case of a crystal of 60 mm or greater diameter, the difficulty of producing low-defect crystal by other methods is especially great. In the case of a still larger crystal of 75 mm or greater diameter, strain is readily imparted during crystal growth, making reduction of total dislocation density difficult. The present invention, which focuses on dislocation distribution, is therefore useful for achieving high crystal quality. In the case of a crystal of greater than 250 mm diameter, it is considered that, owing to the difficulty of single crystal growth and other factors, non-dislocation defects that are hard to annihilate by the thermal cycling treatment become the main problem. The present invention is therefore effective when applied to crystal of a diameter not greater than about 250 mm.

The length of the crystal grown from the seed crystal is preferably 15 mm to 200 mm. A length of less than 15 mm is undesirable from the viewpoint of productivity because a large amount of seed crystal is consumed in each growth cycle and, moreover, the crucible must be frequently heated and cooled for crystal growth. Although a longer length is preferable from the aspect of productivity, a length of greater than 200 mm makes stable crucible temperature control difficult and markedly lowers yield. A long growth period increases the likelihood that sporadic events, such as power supply instability or vibration, will occur in the course of crystal growth to destabilize the growth and cause generation of new defects.

EXAMPLES

Example 1

Figure 3:
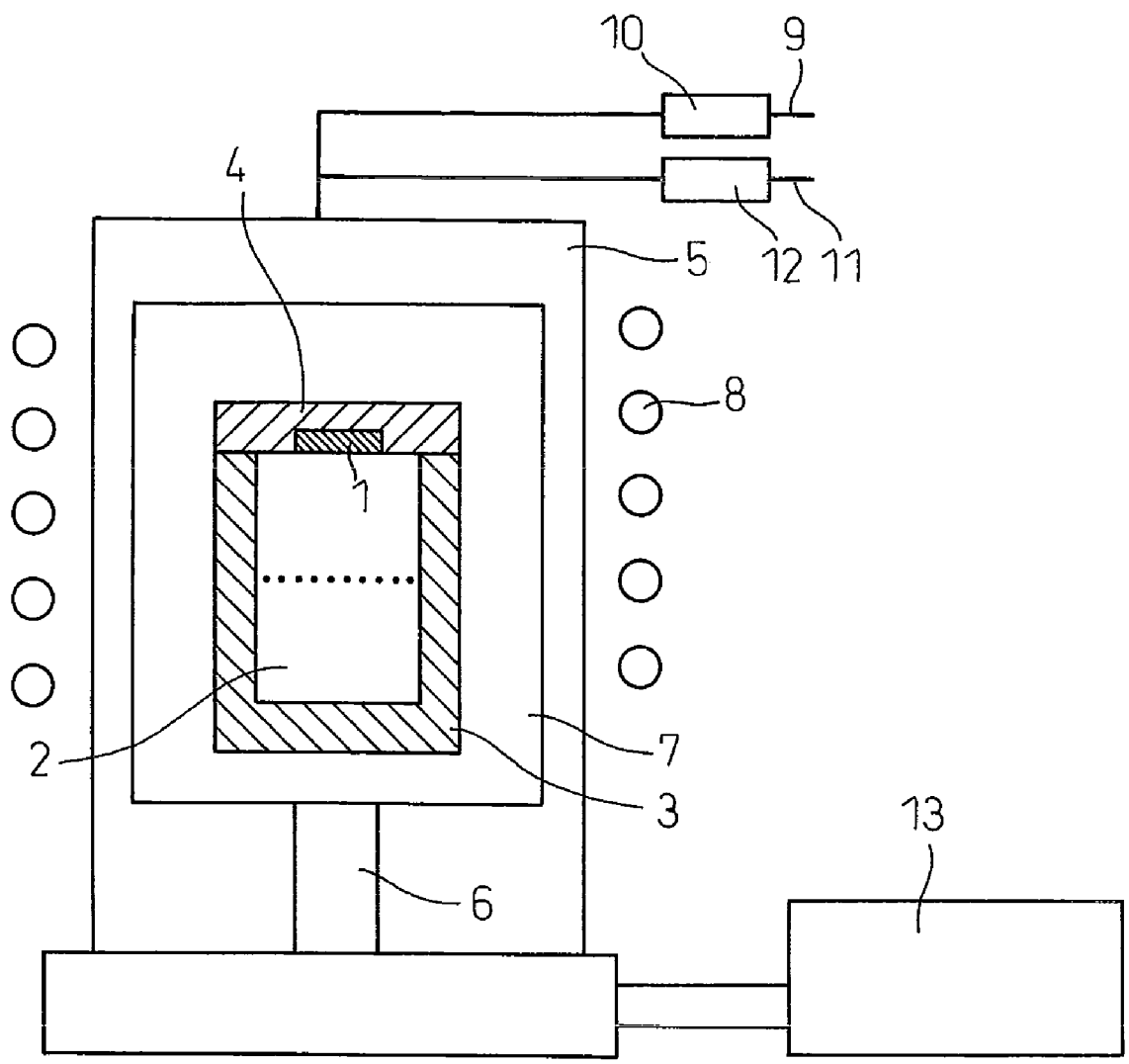
FIG. 3 is diagram showing an example of the structure of a single crystal growth apparatus used in the invention production method.

A single crystal production apparatus for producing the invention single crystal, such as shown in FIG. 3, was used to produce single crystal. A 52 mm diameter 4H SiC single-crystal substrate having a {0001} surface was prepared as seed crystal. A seed crystal was cut from the crystal, which had a total dislocation density of about 12,000/cm², and then machined. Next, the seed crystal 1 was attached to the inner surface of the graphite crucible lid 4 of a graphite crucible 3. Powdery SiC crystal raw material 2 was charged into the graphite crucible 3 after cleansing.

Next, the graphite crucible 3 charged with the raw material was closed with the graphite crucible lid 4, wrapped in graphite felt 7, and placed on a graphite pedestal 6 inside a dual-wall quartz sheath 5. The interior of the quartz sheath was evacuated with a vacuum pumping unit 13 and then supplied with an atmosphere gas composed of a mixed gas of high-purity Ar gas mixed with about 7% nitrogen gas obtained by using an Ar gas mass flow controller 10 connected to an Ar gas supply line 9 and a nitrogen gas mass flow controller 12 connected to a nitrogen gas supply line 11 to regulate the mixing ratio of the two gasses. Then, with the interior of the quartz sheath maintained at a fixed reduced pressure, electric current was passed through a work coil 8 to heat the raw material to the desired temperature of 2,400° C. and thereby grow crystal on the substrate. The growth rate averaged about 1 mm/hr. Optical paths of 2 to 4 mm diameter were formed at the centers of the felt covering the top and bottom of the crucible, and measurement of crucible temperature in the course of crystal growth was conducted using a two-color pyrometer. The temperature of the crucible bottom was defined as the raw material temperature and that at the crucible top as the seed temperature. The crystal growth time was about 25 hours and the crystal height was about 25 mm. After the start of crystal growth, the seed crystal temperature was raised and lowered within the range of 2,250° C. to 2,310° C. in approximately 3-hr cycles over a period of about 12 hr of the growth time. The temperature of the seed was controlled by the method of raising and lowering the coil position and of controlling the coil current. FIG. 2 schematically illustrates the temperature cycle of this thermal cycling treatment.

Substrates of 0.4-mm thickness having the {0001} surface as the major surface were cut from the grown crystal using a wire saw, cleansed and polished. All substrates were 4H single crystals, and were ascertained by X-ray diffraction and X-ray topography imaging not to contain any polycrystal. The polished substrates were etched with KOH and their dislocation distributions were examined.

The way the substrates were divided into regions is schematically illustrated in FIG. 1. As shown, the whole substrate was divided into 5-mm square regions with the 5-mm square mesh (No. 45) in the middle defined as the substrate center. Only the meshes totally contained within the substrate were counted as "regions" (the halftone dotted portion in FIG. 1) and those at the substrate edges where the 5-mm square meshes were partially missing (Nos. 03, 12 etc.) were excluded from the count. Among all regions, the numbered regions containing dislocation pits of 5 µm or less spacing were sequentially summed and divided by the total number of meshes (those without missing edge areas) to calculate their ratio (%). The result was that 16% were regions containing dislocation pairs and/or dislocation rows. The average dislocation density of the regions having no dislocation pairs or dislocation rows was 3,500/cm². The substrate measured about 52-mm in diameter, substantially the same size as the seed crystal.

Example 2

Crystal growth was conducted similarly to in Example 1 using a large diameter crucible and a substrate of 70-mm diameter size as a seed crystal. The total dislocation density of the seed crystal was about 10,000/cm². Between the fifth to tenth hour of crystal growth, thermal cycling treatment consisting of 5 temperature cycles within a 60° C. range was conducted similarly to in Example 1. Observation of dislocation distribution by the same method as in Example 1 revealed presence of dislocation pairs and/or dislocation rows in 32% of the regions. The average dislocation density of the regions having no dislocation pairs or dislocation rows was 5,000/cm². The substrate measured about 72-mm in diameter.

Example 3

Crystal was produced by the same method as set out in Example 1. A substrate cut from the crystal was polished, and an approximately 10-µm thick SiC single crystal film was grown on the substrate surface in 2 hr using a commercially available CVD epitaxial growth system for SiC.

The epitaxial film was grown on a substrate whose plane orientation was inclined by 4° from <0001>. Its surface dislocation distribution was observed as set out in Example 1. Dislocation pairs and/or dislocation rows were found to be present in 10% of the regions. The average dislocation density of the regions having no dislocation pairs or dislocation rows was 4,000/cm². The ratio of regions with dislocation pairs and or dislocation rows was on substantially the same level as the dislocation distribution of the substrate. Although a small increase was seen in the dislocation density of portions with no dislocation rows, the level was substantially the same.

Example 4

Crystal was grown by repeating the method of Example 1 except for changing the content of introduced nitrogen. The stability of the 4H polytype during crystal growth was studied. The nitrogen content of the SiC single crystal substrate was examined by secondary ion mass spectrometry. Growth was conducted 10 times under condition of changing nitrogen content. On examination of the crystal obtained, it was found that the number of instances in which crystal polytype other than 4H was observed was one when nitrogen atoms were contained at the rate of $(1-4)\times10^{18}$ cm$^{-3}$, zero when nitrogen atoms were contained at the rate of $(5-9)\times10^{18}$ cm$^{-3}$, and one when nitrogen atoms were contained at the rate of $(1-9)\times10^{19}$ cm$^{-3}$. Complete crystal type conversion was not observed in any instance. On the other hand, the number of instances in which crystal polytype other than 4H was observed was five when nitrogen atoms were contained at the rate of $(5-9)\times10^{17}$ cm$^{-3}$.

Example 5

Experiments were conducted under various conditions in order to investigate the effect of the temperature cycle for reducing dislocation density. The setup and method of growth were both the same as in Example 1.

SiC single crystal substrates of 52-mm, 77-mm and 82-mm in diameter having {0001} plane were prepared as seed crystals.

The growth conditions, the ratios of regions of crystals containing dislocation pairs and/or dislocation rows, and the dislocation densities of crystals containing no dislocation pairs or dislocation rows are shown in the Table 1, respectively. The number of temperature cycles constituting the thermal cycling treatment includes the number conducted during crystal growth after growth started, the number during high-temperature heating of the crucible during growth and after growth, and the number during high-temperature heating for reheating after cooling for crystal growth termination.

In every case of applying the thermal cycling treatment of the present invention, dislocation density was reduced and the ratio of regions containing dislocation pairs and/or dislocation rows was 50% or temperature cycles was 1 or 0, the ratio of regions containing dislocation pairs and/or dislocation rows was in every case greater than 50%, and not only was there no dislocation density reduction effect but in some instances the density increased.

The diameter of the seed crystal substrate and grown crystal was 52 mm in Invention Examples 1 to 8 and Comparative Examples 1 and 2, and 77 mm and 82 mm in Invention Examples 9 and 10, respectively. The seed crystals used in Invention Examples 1 to 6 had a ratio of regions containing dislocation pairs and/or dislocation rows of 60% or greater. In Invention Examples 7 and 8, seed crystals cut from the crystals produced in Invention Examples 1 and 2, respectively, were used to conduct new crystal growth. The seed crystals used in Invention Examples 9 and 10 had a ratio of regions containing dislocation pairs and/or dislocation rows of about 60%. In Invention Example 6 with reheating, there was used a thermal cycling treatment in which half of the temperature cycles were conducted during crystal growth and the remaining half were conducted during reheating following cooling.

TABLE 1

| | Average dislocation density[1] | Thermal cycling treatment conditions {T1; T2; n; ts}[2] | {Above: Ave dislocation density Below: Regions}[3] |
|---|---|---|---|
| Invention 1 | 4H, 13000 | T1: 2250; T2: 2310; n: 6; ts: 18 | 6000 24% |
| Invention 2 | 4H, 7800 | T1: 2050; T2: 2510; n: 50; ts: 180 | 2000 8% |
| Invention 3 | 4H, 5000 | T1: 2050; T2: 2210; n: 4; ts: 12 | 1500 5% |
| Invention 4 | 4H, 15000 | T1: 2150; T2: 2300; n: 10; ts: 36 | 4500 24% |
| Invention 5 | 6H, 10000 | T1: 2150; T2: 2310; n: 8; ts: 18 | 5800 40% |
| Invention 6 | 4H, 2000 | T1: 2050; T2: 2410; n: 150 (w/reheating); ts: 300 | 800 5% |
| Invention 7 | 4H, 6000 | T1: 2250; T2: 2310; n: 8; ts: 24 | 1000 5% |
| Invention 8 | 4H, 2000 | T1: 2050; T2: 2410; n: 8; ts: 24 | 700 3% |
| Invention 9 | 4H, 10000 | T1: 2150; T2: 2310; n: 8; ts: 18 | 6000 40% |
| Invention 10 | 4H, 13000 | T1: 2250; T2: 2350; n: 10; ts: 28 | 7000 40% |
| Comparative 1 | 4H, 10000 | T1: 2150; T2: 2310; n: 1; ts: 3 | 10000 58% |
| Comparative 2 | 4H, 3500 | No temp. cycles | 5700 63% |

Remarks:
[1] Crystal type of seed substrate used and average dislocation density (/cm²) of seed crystal regions containing no dislocation rows.
[2] Thermal cycling treatment conditions: {Minimum temperature T1 (° C.), Maximum temperature T2 (° C.), Number of cycles n, and Total cycle treatment time ts (hr)}.
[3] (Above) Average dislocation density (/cm²) of grown substrate regions containing no dislocation pairs or dislocation rows, (Below: Regions containing dislocation pairs and/or dislocation rows (%).

The invention claimed is:

1. An SiC single-crystal substrate wherein, when the SiC single-crystal substrate is divided into 5-mm square regions, such regions in which dislocation pairs or dislocation rows having intervals between their dislocation end positions of 5 µm or less are present among the dislocations that have ends at the substrate surface account for 50% or less of all such regions within the substrate surface.

2. An SiC single-crystal substrate wherein, when the SiC single-crystal substrate is divided into 5-mm square regions, such regions in which dislocation pairs or dislocation rows having intervals between their dislocation end positions of 5 µm or less are present among the dislocations that have ends at the substrate surface account for 10% or less of all such regions within the substrate surface.

3. An SiC single-crystal substrate according to claim 1 or 2, wherein the dislocation density in the substrate of dislocations other than the dislocation pairs or dislocation rows is 8,000/cm² or less.

4. An SiC single-crystal substrate according to claim 1, wherein the polytype of the SiC single-crystal substrate is 4H or 6H.

5. An SiC single-crystal substrate according to claim 1, wherein the plane direction of the SiC single-crystal substrate is a {0001} plane or a direction inclined within 10° from a {0001} plane.

6. An SiC single-crystal substrate according to claim 1, wherein the SiC single-crystal substrate is substantially disk-shaped and the disk has a diameter of 60 mm or greater.

7. An SiC single-crystal substrate according to claim 1, wherein the SiC single-crystal substrate contains nitrogen atoms at the rate of $1\times10^{18}$ cm$^{-3}$ or greater.

8. An SiC single-crystal substrate with an epitaxial film comprising an SiC single-crystal formed with a 3-μm to 30-μm thick epitaxial thin film, wherein, when the thin-film surface of the SiC single-crystal formed with the epitaxial thin film is divided into 5-mm square regions, such regions in which dislocation pairs or dislocation rows having intervals between their dislocation end positions of 5 μm or less are present among the dislocations that have ends at the substrate surface account for 50% or less of all such regions within the substrate surface.

9. An SiC single-crystal substrate with an epitaxial film according to claim 8, wherein the SiC single-crystal substrate is divided into 5-mm square regions, such regions in which dislocation pairs or dislocation rows having intervals between their dislocation end positions of 5 μm or less are present among the dislocations that have ends at the substrate surface account for 50% or less of all such regions within the substrate surface.

* * * * *